United States Patent [19]
Sundaram et al.

[11] Patent Number: 6,163,225
[45] Date of Patent: Dec. 19, 2000

[54] METHOD AND APPARATUS FOR ACHIEVING LOW STANDBY POWER USING A POSITIVE TEMPERATURE CORRELATED CLOCK FREQUENCY

[75] Inventors: Rajesh Sundaram, Fair Oaks; Sandeep K. Guliani, Folsom, both of Calif.

[73] Assignee: Intel Corporation, Santa Clara, Calif.

[21] Appl. No.: 09/305,976

[22] Filed: May 5, 1999

[51] Int. Cl.[7] .............................. H03B 5/24; H03B 5/04
[52] U.S. Cl. ........................ 331/57; 331/111; 331/143; 331/176
[58] Field of Search ............................... 331/57, 65, 66, 331/111, 143, 175, 176

[56] References Cited

U.S. PATENT DOCUMENTS

| | | |
|---|---|---|
| 5,410,510 | 4/1995 | Smith et al. . |
| 5,870,345 | 2/1999 | Stecker .................... 365/222 |
| 5,889,441 | 3/1999 | Inn ........................... 331/143 |

*Primary Examiner*—David Mis
*Attorney, Agent, or Firm*—Blakely, Sokoloff, Taylor & Zafman LLP

[57] ABSTRACT

A method for generating a positive temperature correlated clock frequency is described. The method comprises conducting current through a resistor to charge a capacitor. When the capacitor is charged to a trip point of the inverter at the input of the inverter chain, a transition in an output signal of an inverter chain is triggered. The capacitor is discharged through a grounding device when the output signal activates said grounding device.

39 Claims, 6 Drawing Sheets

METHOD AND APPARATUS FOR ACHIEVING LOW STANDBY POWER USING A POSITIVE TEMPERATURE CORRELATED CLOCK FREQUENCY

FIELD OF THE INVENTION

The present invention relates generally to a resistor and capacitor based oscillator. More particularly, the present invention relates to a method and apparatus for achieving low standby power using a positive temperature correlated clock frequency.

BACKGROUND OF THE INVENTION

Many of today's computing applications such as cellular phones, digital cameras, and personal computers, use non-volatile memories to store data or code. Nonvolatility is advantageous because it allows the computing system to retain its data and code even when power is removed from the computing system. Thus if the system is turned off or if there is a power failure, there is no loss of code or data. Such nonvolatile memories include Read-Only Memory (ROMs), Electrically Programmable Read-Only Memory (EPROMs), Electrically Erasable Programmable Read-Only Memory (EEPROMs), and flash Electrically Erasable Programmable Read-Only Memory (flash EEPROMs or flash memory). However, only EEPROMs and flash memory are electrically re-writable within the host system, making these memories more flexible and easier to use.

Nonvolatile semiconductor memory devices are fundamental building blocks in computer system designs. One such nonvolatile memory device is flash memory. Flash memory can be programmed by the user, and once programmed, the flash memory retains its data until the memory is erased. Electrical erasure of the flash memory erases the contents of the memory of the device in one relatively rapid operation. The flash memory may then be programmed with new code or data. The primary mechanism by which data is store in flash memory is a flash memory cell. Accordingly, outputs of a flash memory device are typically associated with an array of flash cells that is arranged into rows and columns such that each flash cell in the array is uniquely addressable.

A flash EEPROM memory device (cell) is a floating gate MOS field effect transistor having a drain region, a source region, a floating gate, and a control gate. Conductors are connected to each drain, source, and control gate for applying signals to the transistor. A flash EEPROM cell is capable of functioning in the manner of a normal EPROM cell and will retain a programmed value when power is removed from the circuitry. A flash EEPROM cell may typically be used to store a one or zero condition. If multilevel cell (MLC) technology is used, multiple bits of data more be stored in each flash EEPROM cell. Unlike a typical EPROM cell, a flash EEPROM cell is electrically erasable in place and does not need to be removed and diffused with ultra-violet to accomplish erasure of the memory cells.

Arrays of such flash EEPROM memory cells have been used in computers and similar circuitry as both read only memory and as long term storage which may be both read and written. These cells require accurate values of voltage be furnished in order to accomplish programming and reading of the devices. Arrays of flash EEPROM memory devices are typically used for long term storage in portable computers where their lightweight and rapid programming ability offer distinct advantages offer electromechanical hard disk drives. However, the tendency has been to reduce the power requirements of such portable computers to make the computers lighter and to increase the length of use between recharging. This has required that the voltage potentials available to program the flash memory arrays be reduced. It is now necessary to generate such precision voltage potentials within the circuitry for controlling the flash EEPROM memory array. High precision voltages are also useful for providing faster read times and better reliability of the flash EEPROM cells.

A number of the electronic systems that use flash memories are small portable devices that rely on batteries for power. Consequently, it is desirable to increase the battery life of these devices by reducing power consumption. The power consumption is reduced in many of these portable electronic devices by operating specific circuits or components in a lower power standby mode during periods when these components are not required. Typically, this low power standby mode would reduce the overall current consumed by the component.

The charge pumps and reference voltage generating circuits in flash memory devices are mostly turned off in a standby/deep power-down mode to save power consumption. But the pumps and reference voltage generator need to be turned on periodically to charge the positive and negative nodes towards the read level voltages. This process is to enable the flash device to enter the 'read mode' as soon as there is a read request while the flash device is in standby/deep power-down mode. When these circuits are turned off, the positive and negative read nodes get discharged due to leakage. The leakage, and hence the read nodes discharging, is positively related to temperature. Hence, there is a need to turn on the pumps and reference voltage generators more often at high temperatures to compensate for the higher discharge rate.

The enabling circuits that have been used so far, such as the medium frequency oscillator (MFO) which periodically turn on the pumps and reference generators in the standby/deep power-down mode, have had a negative frequency correlation with temperature. Hence, these enabling circuits were designed to cover the worst case discharge rate at high temperatures. As a result, the MFO would turn on the charge pumps and the reference generator for recharging nodes more often at low temperatures than necessary despite lower the discharge rates. Hence, the standby/deep power-down power consumption of the flash device was high and unoptimized.

SUMMARY OF THE INVENTION

A method for generating a positive temperature correlated clock frequency is described. The method comprises conducting current through a resistor to charge a capacitor. When the capacitor is charged to a trip point of the inverter at the input of the inverter chain, a transition in an output signal of an inverter chain is triggered. The capacitor is discharged through a grounding device when the output signal activates said grounding device.

Other features and advantages of the present invention will be apparent from the accompanying drawings and from the detailed description that follow below.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for generating a positive temperature correlated clock frequency is disclosed. The described resistor and capacitor based oscillator (RCO) periodically enables voltage regulation circuitry and charge pumps in low power standby modes in nonvolatile writable memory, but is not so limited. Advantages for one embodiment of the RCO may include the consumption of less current, better control of frequency resulting from a reduced sensitivity to VCC and temperature changes, and the providing of a large range of frequencies. The RCO described herein is described in the context of a nonvolatile writable memory or flash memory, but is not so limited. Although the following embodiments are described with reference to nonvolatile writable memories and flash memory, other embodiments are applicable to other circuits that use low power standby modes. The same techniques and teachings of the embodiments can easily be applied to other types of circuits that use clock signals.

There is charge leakage on certain nodes in the flash part due to well-substrate leakage, well-diffusion leakage, substrate leakage during standby mode. Even though the devices are off leakage still occurs. In a flash memory, there may be thousands of X-decoders coupled to wordlines for addressing the memory cells. When the leakage current of all these X-decoders are summed up, the current may on the order of hundreds of nano-amps. Thus the voltage potentials on these nodes may droop from operational valued over time. Positive nodes may droop from pumped levels towards ground potential and negative nodes may droop from negative potentials up towards ground. But when a user wants to read from the memory and enables the chip, the nodes have to be ready so that an valid memory access can happen within a very short amount of time. Hence during standby, certain read nodes have to be kept refreshed so that the flash part is ready.

The oscillator is used during standby mode to generate periodic pulses for turning on the charge pumps and the reference generating circuits, which otherwise would be off during standby mode to save power. The charge pumps and reference generator need to be turned on to refresh and charge up the positive and negative nodes required to read from the flash part. If the nodes are properly charged to read mode potentials, the flash part may enter into read mode quickly when brought out of reset or standby mode. However, in order to keep power consumption down, the standby current needs to be as low as possible. Hence, power consumption would be better managed if the oscillator frequency has a positive temperature coefficient. A higher frequency is desired at higher temperatures because the leakage current is greater at high temperature and the pumps need to be turned on more often than at low temperatures to refresh the nodes to read mode potentials.

Figure 1:
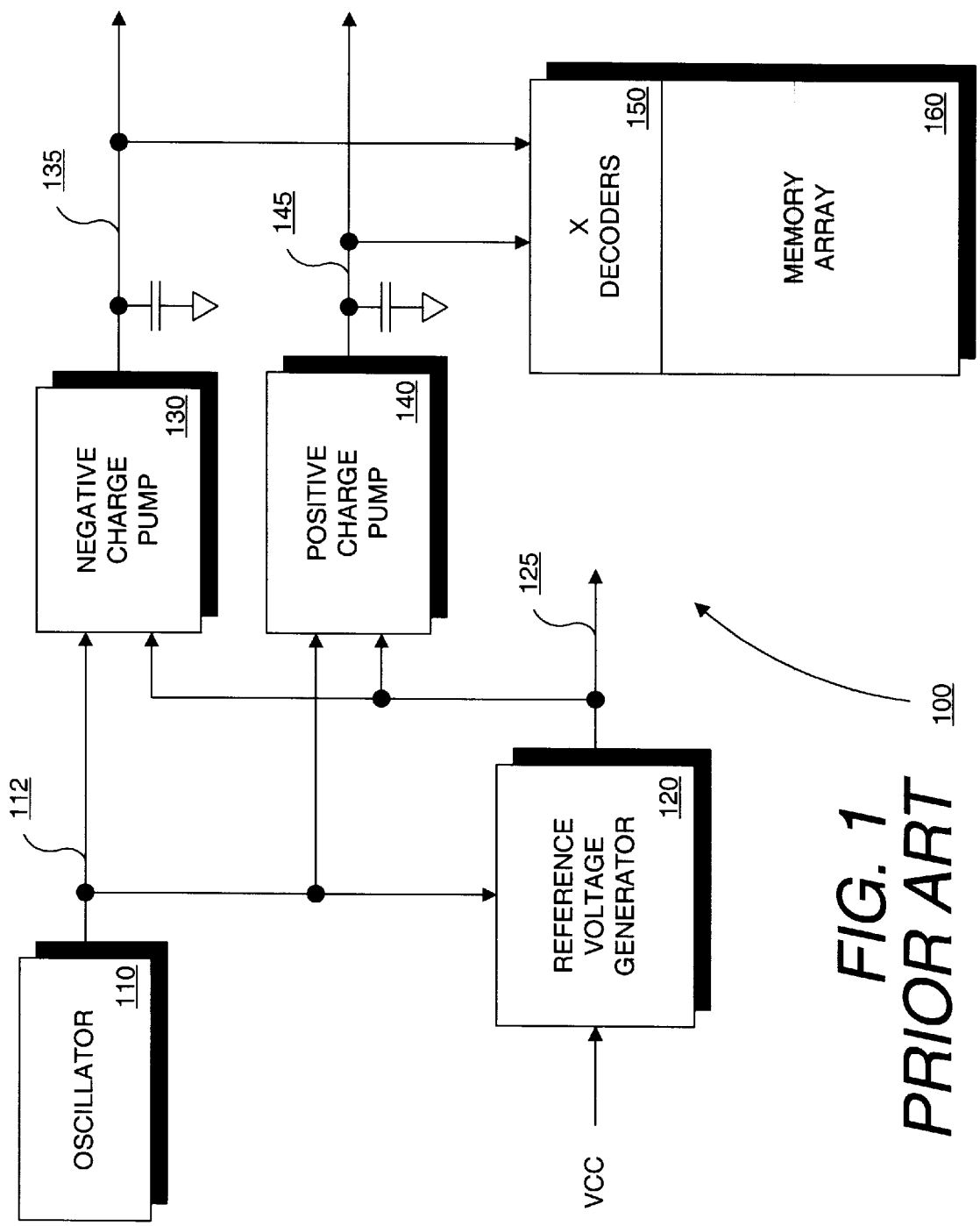
FIG. 1 illustrates a typical prior art flash memory circuit used in a low power standby mode.

FIG. 1 illustrates a typical prior art flash memory circuit 100 used in a low power standby mode. Reference voltage generator 120 provides a reference voltage at node 125 to both positive charge pump 140 and negative charge pump 130. Voltages provided by charge pumps and other circuitry implemented as part of integrated circuits typically vary due to factors such as operating temperatures, supply voltages, process variations, and load currents. Reference voltages may be used to regulate the output voltage of charge pumps. The positive charge pump 140 provides a regulated voltage of approximately five volts at its output 145. The positive charge pump output 145 supplies the X-decoders 150 of the memory array 160. The memory array 160 may include thousands to millions of flash cells, including multiple level cell flash transistors. The negative charge pump 130 provides a regulated voltage of approximately negative five volts. The negative charge pump output 135 also supplies the X-decoders 150 of the memory array 160. The wordline voltages are controlled during read operations in flash memories in order to reliably interpret the values stored in memories cells. In order to conserve power in portable computing devices, specific components such as the flash memory may be placed into a low power standby mode when these components are not required.

When the flash memory needs to be accessed, it comes out of standby mode. However, the wordline voltages and regulation voltages tend to droop over time due to leakage. In order to quickly and accurately read the flash cells when coming out of standby mode, wordline voltages and reference voltages need to be maintained during standby mode while minimizing the current drawn by the circuit. Maintaining these wordline voltages requires current because the junctions and diffusions on the nodes of the positive pump 140, the negative pump 130, and the reference generator 120 result in a current leakage while the circuit is in standby mode. The most power efficient method of accommodating this leakage current is to use an oscillator 110 to periodically pulse or refresh the positive pump 140, the negative pump 130, and the reference generator 120.

A problem with the typical prior art flash memory 100 is that the leakage current is not the same for the positive pump 140, the negative pump 130, and the reference generator 120. Typically, the positive pump 140 has more leakage, so the positive pump 140 has the highest refresh rate, approximately 100 microseconds. The reference generator 120 has a refresh rate of approximately 1 millisecond. The negative pump 130 has the slowest refresh rate, approximately 10 milliseconds.

A typical prior art oscillator 110 only outputs one clock signal 112, so these different refresh rates among components result in the oscillator 110 pulsing at a frequency that is the highest of the frequencies required by any of these components. Thus while the oscillator 110 pulses at a higher frequency to accommodate the refresh rate of the positive pump 140, the current drawn is higher because the negative pump 130 and the reference generator 120 are also being turned on and drawing current when they are not required to be turned on.

Figure 2:
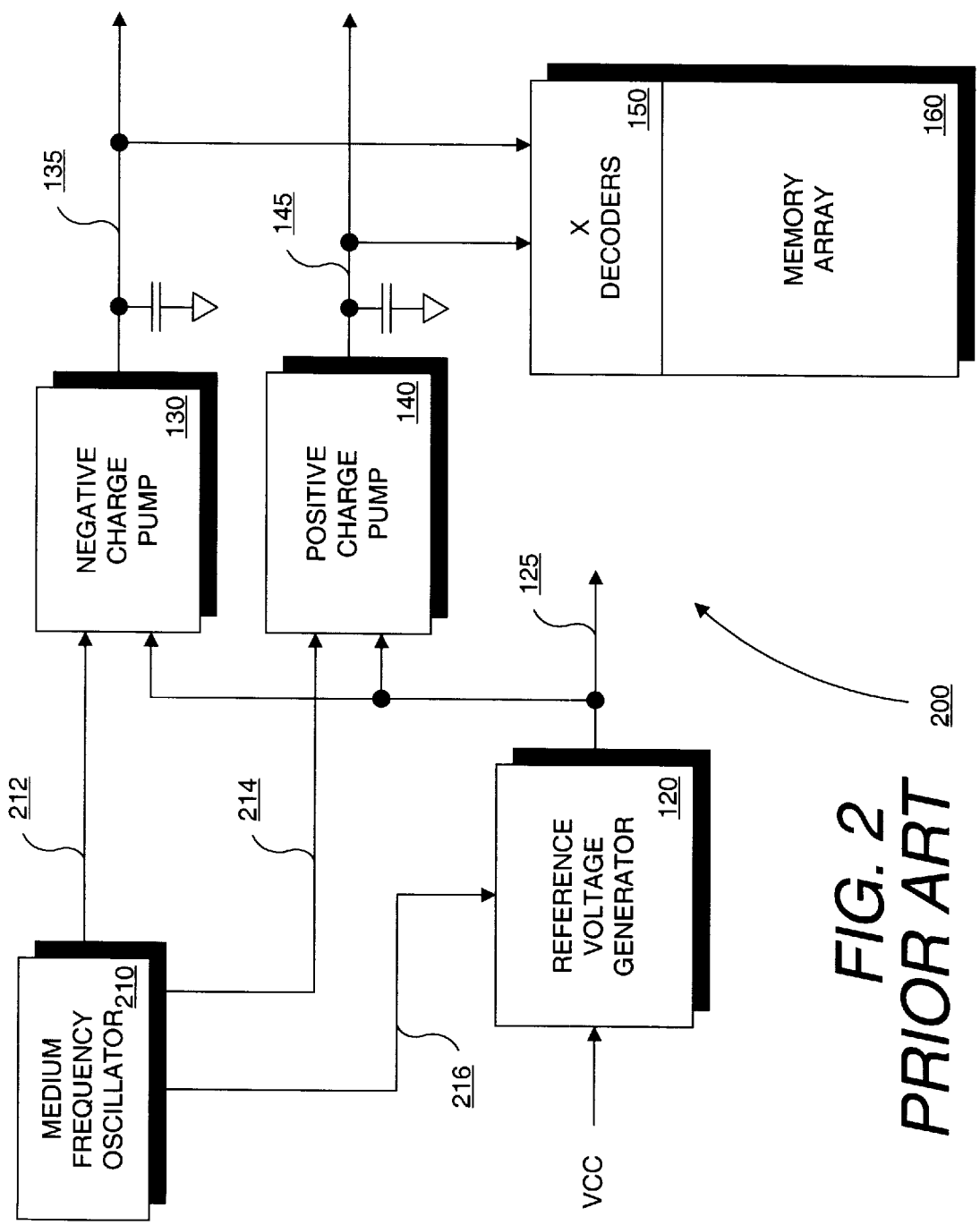
FIG. 2 illustrates a prior art flash memory circuit using a medium low frequency oscillator (MFO)

FIG. 2 illustrates a prior art flash memory circuit 200 using a medium frequency oscillator 210. The reference generator 120 provides a reference voltage 125 of approximately two volts to both the positive pump 140 and the negative pump 130. The positive pump 140 provides a regulated voltage of approximately five volts over decode supply line 145 to the X-decoders 150 of the memory array 160. The negative pump provides a regulated voltage of approximately negative five volts over decoder supply line 135 to the X-decoders of memory array 160. The medium frequency oscillator (MFO) 210 provides low frequency clock signals 212, 214, 216 that periodically pulse or enable the negative pump 130, the positive pump 140, and the reference generator 120, respectively, when the circuit is in a standby mode. The medium frequency clock signals 212, 214, 216 may each have a different frequency, but they are not so limited. A low frequency oscillator (LFO) may also be used in the flash memory circuit. The LFO and MFO were both used to generate enable signals for the charge pumps and reference generator during standby mode to compensate for the charge loss on the read nodes.

Both the LFO and MFO required low bias currents, so a separate bias circuit had to be included to bias current for operation. Bias signals generated from an bias circuit are coupled to the oscillator. These bias signals serve to control the amount of current through the oscillator stage. By limiting the current, the frequency of the oscillator could be reduced. As a result, the LFO and MFO used current mirror circuits. However, current mirrors are sensitive to transistor device mismatches and threshold voltage (Vt) variations. Because of the sensitivity to VCC levels, these circuits also required a special circuit to filter noise on VCC. Furthermore, the LFO and MFO had a dependence on the subthreshold operation of the transistor devices.

The LFO period also had a strong negative coefficient with VCC. This meant that if the LFO was designed to turn on the pumps for a low VCC corner, the LFO pulses would end up turning on the pumps more often at higher VCC levels, thereby consuming more standby current than necessary.

On the other hand, the MFO period had a lesser negative coefficient with VCC variations, but the MFO had positive coefficient with temperature. This meant the MFO would turn the pumps on less frequently at high temperatures, which is where the pumps needed to be turned on more often due to higher leakage.

Figure 3:
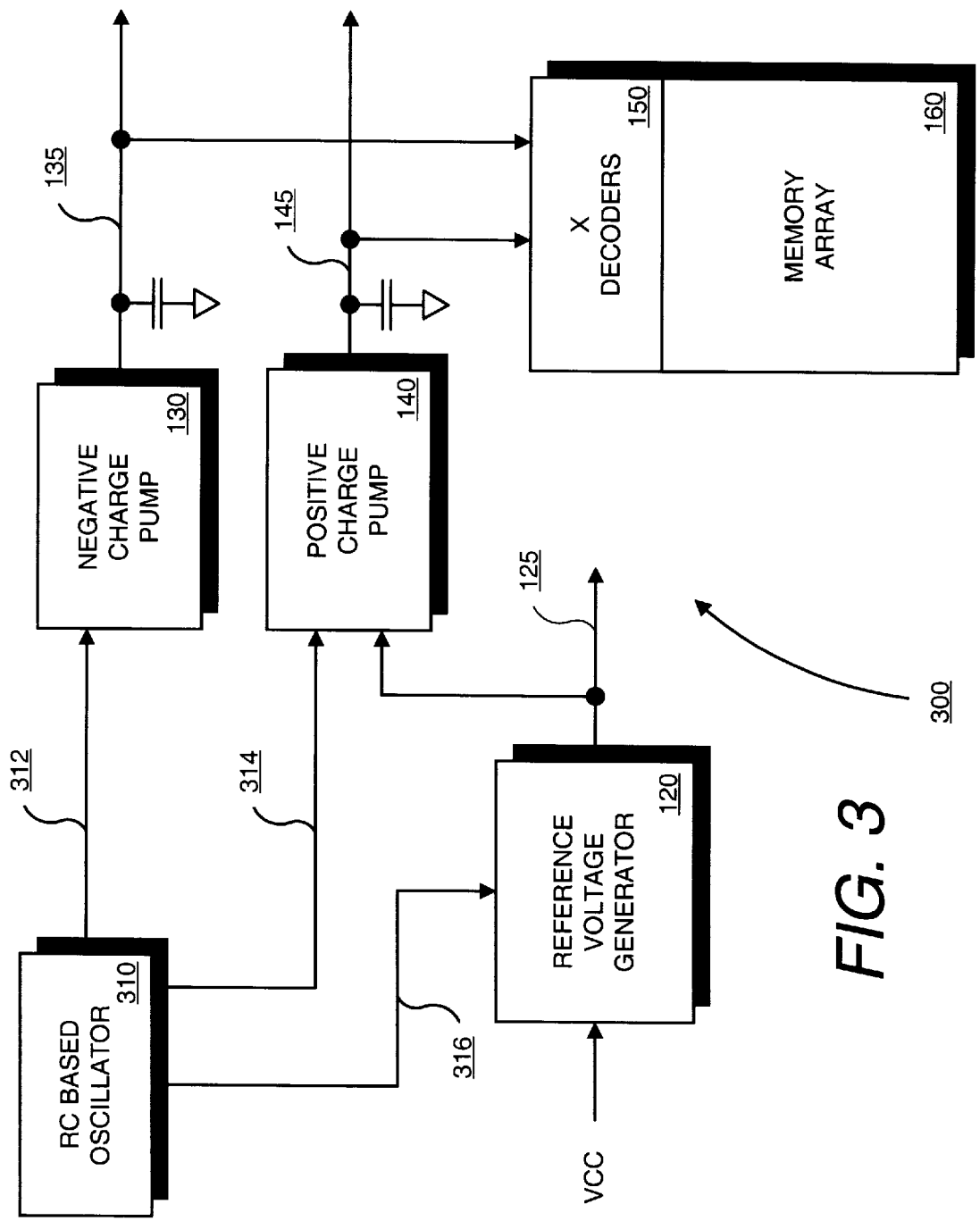
FIG. 3 illustrates a flash memory circuit using a resistor and capacitor based oscillator (RCO) of one embodiment.

FIG. 3 illustrates a flash memory circuit 300 using a resistor and capacitor based oscillator (RCO) of one embodiment of the invention. Reference generator 120 provides a reference voltage 125 to the positive pump 140. The positive pump 140 provides a regulated voltage of approximately five volts over decode supply line 145 to the X-decoders 150 of the memory array 160. The negative pump provides a voltage of approximately negative five volts over decoder supply line 135 to the X-decoders of memory array 160. The MFO 210 of FIG. 2 has been replaced with the RCO 310. The RCO may be used to replace the LFO or the MFO, or even both. The RCO 310 provides low frequency clock signals 312, 314, 316 that periodically pulse or enable the negative pump 130, the positive pump 140, and the reference generator 120, respectively, when they are in a standby mode. The clock signals 312, 314, 316 may each have a different frequency.

The reference voltage generator circuit 120 of one embodiment is a sample and hold circuit comprising a large sample capacitor for storing charge. This sample and hold circuit allows for a reduction in current used during the standby mode in spite of the high refresh rate of the positive pump 140. The sample and hold reference generator circuit 120 reduces the current in standby mode by storing charge on a large capacitor, thereby eliminating the need for the reference generator 120 to be activated every time the positive pump 140 is activated.

The methodology of one embodiment involves an oscillator circuit which generates a clock, whose frequency is positively correlated with temperature. The clock pulse is used to turn on the positive charge pump, the negative charge pump, and the sampled reference voltage generator during standby and deep power-down mode. In the standby and deep power-down mode, the charge pumps and the reference generator are mostly turned off to save power. These circuits need to be periodically turned on to charge the internal read nodes towards the read voltage and to replace the charge that is lost during the off condition. Because charge loss on the read nodes is greater during high temperatures, in order to replace the charge lost, the pumps to be turned on more often at high temperatures than at low temperatures. Because of the positive temperature correlation of the enable clock frequency, the charge pumps are turned on more often at high temperatures than at low temperatures and vice versa at low temperatures when the charge loss is less.

This method optimizes the turning on and off of the charge pumps and thus minimizes the power consumed during standby and deep power-down mode. The enable clock frequency is positively correlated with temperature, thus minimizing the power consumption in standby and deep power-down mode. In previous schemes with the MFO, the oscillator frequency was optimized to cover worst case conditions at high temperature. Without the positive correlation of frequency with temperature in those schemes, the charge pumps were turned on more often than required at room temperature or low temperatures.

Figure 4:
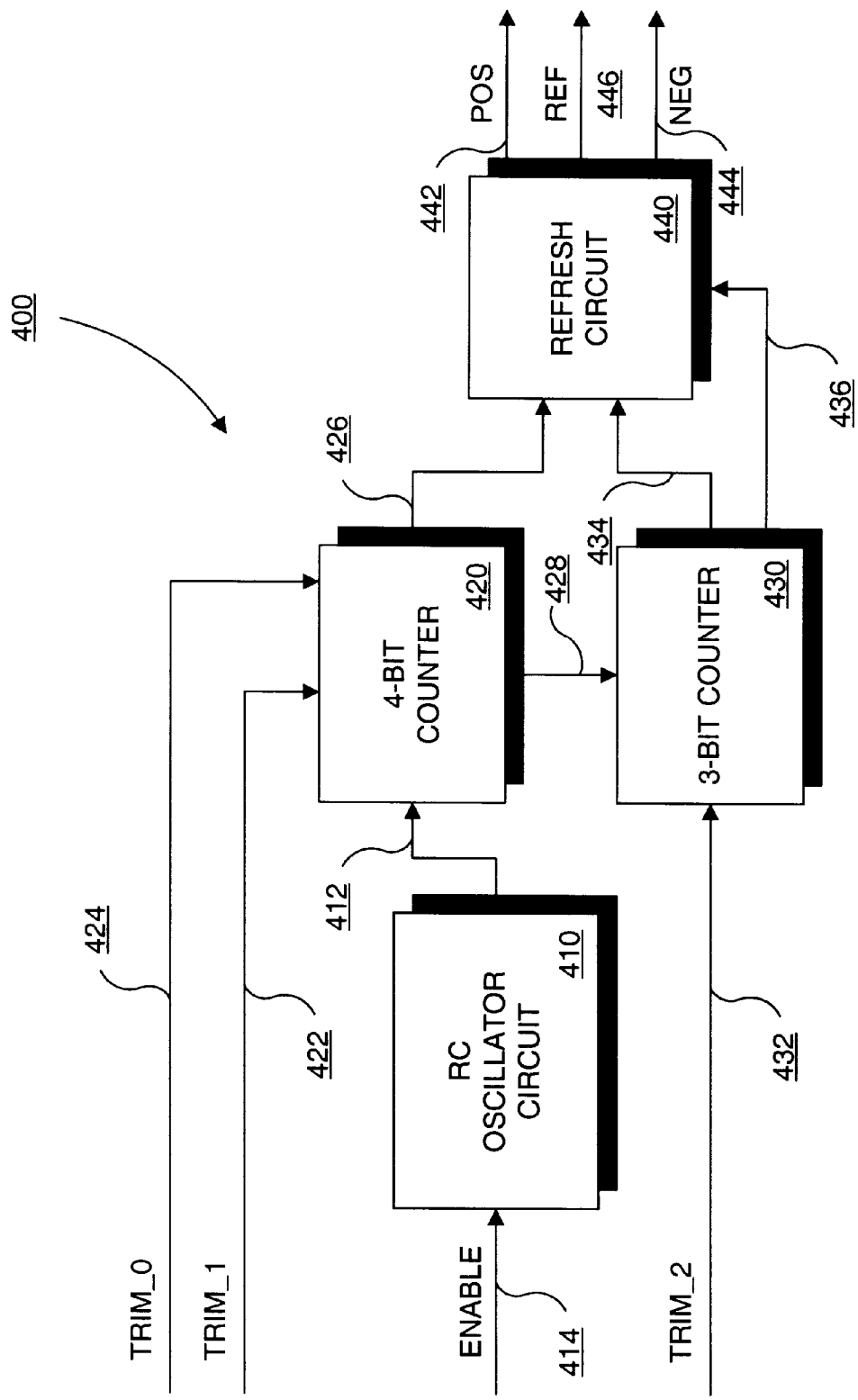
FIG. 4 is a block diagram of a resistor and capacitor based oscillator of one embodiment.

FIG. 4 is a block diagram of a resistor and capacitor based oscillator of one embodiment. This RCO 400 is used during the read and standby modes of the flash memory. The RCO 400 comprises of a resistor and capacitor (RC) oscillator circuit 410 coupled to an ENABLE signal 414. The ENABLE signal 414 is used when the RCO 400 is used with a flash memory because the oscillator 410 is disabled during the program and erase cycles of the flash memory. For another embodiment, the ENABLE signal 414 may also be connected to the 4-bit counter 420 and the 3-bit counter 430.

The RCO basic frequency of one embodiment is divided in two separate stages. The basic frequency is divided by a 4-bit counter 420, whose output 426 determines the frequency of the pulse given to the positive pump 140. The oscillator 410 provides a clock signal output 412 coupled to the 4-bit counter 420. The 4-bit counter 420 also receives signals TRIM_0 424 AND TRIM_1 422. TRIM_0 424 and TRIM_1 422 are optional trim signals for selecting four different frequencies from the 4-bit counter 420. An output 428 from the 4-bit counter 420 is in turn divided by a 3-bit counter 430. The output 434 of the 3-bit counter 430 determines the frequency of the pulse given to the negative pump 130. The output 436 of the 3-bit counter 430 determines the frequency of the pulse given to the reference generator 120. Signal TRIM_2 432 is coupled as an input to the 3-bit counter 430. TRIM_2 432 is an optional trim signal for selecting two different frequencies from the 3-bit counter. The outputs 426, 434, 436 of 4-bit counter 420 and 3-bit counter 430, respectively, are coupled to the refresh circuit 440 which generates the pulses for the pumps 130, 140. Output signal POS 442 from refresh circuit 440 is coupled to the positive pump 140. And output signal NEG 444 is coupled to the negative pump 130. Output signal REF 446 is coupled to the reference generator 120. It is contemplated that for other embodiments, the 4-bit counter 420 or the 3-bit counter 430 may be replaced by other types of counters including a 6-bit counter.

This embodiment of the oscillator may be scaled across both manufacturing process and VCC. The RCO frequency has a positive coefficient with VCC. The low VCC sensitivity in combination with the ability to function at low VCC levels makes this circuit easy to port to a new manufacturing process and to uses with different VCC ranges. The RCO circuit has good internal VCC noise rejection and hence, there is no need for a separate VCC noise filter. Unlike the LFO and MFO, the RCO circuit is insensitive to device mismatches, making the circuit more robust. The RCO circuit does not need a bias circuit either.

Furthermore, the RCO circuit is self starting for one embodiment. Because the oscillator can start in a stable region of operation, there is no need for a starter circuit. The LFO and MFO both have a stable operating point at zero current and require a starter circuit to initiate operation. Unlike the LFO and MFO, the RCO circuit cannot get stuck in a non-operation mode. Hence the RCO circuit reduces complexity in the design and saves die space by not requiring a separate starter circuit to help the circuit to get out of that mode.

Figure 5:
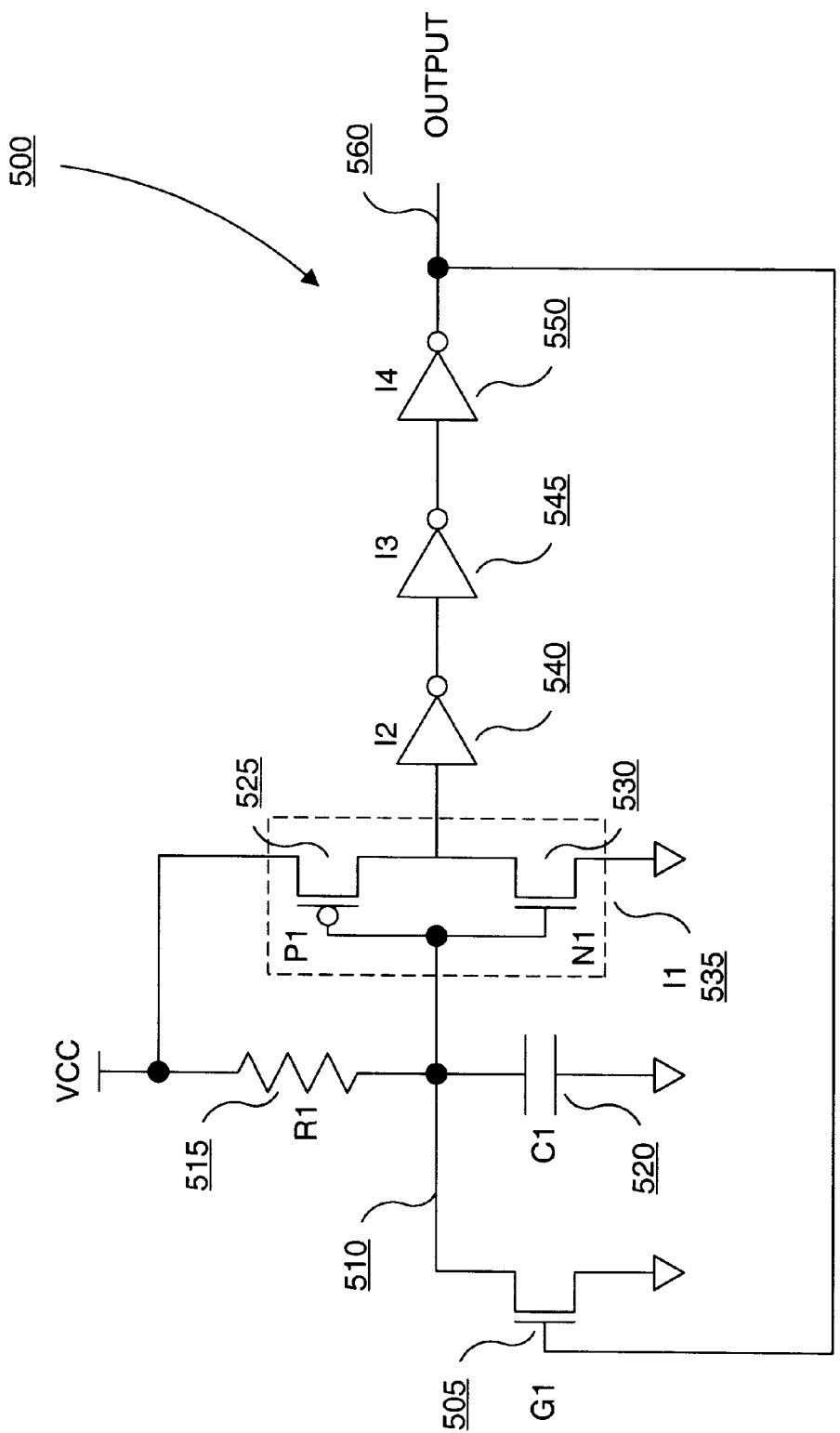
FIG. 5 is a schematic of a RCO circuit of one embodiment.

FIG. 5 is a schematic of a RCO circuit 500 of one embodiment. The RCO circuit 500 comprises of a resistor 515 and capacitor 520 combination, a chain of inverters 530, 535, 540, 545 connected in series, and a reset device 505. Resistor (R1) 515 is connected to supply voltage VCC at a first terminal, and at its second terminal connected in series with a first terminal of capacitor (C1) 520 at node 510. The second terminal of C1 520 is connected to a ground potential. The potential at node 510 increases as the charge on C1 increases. The resistor is constructed from polycrystalline silicon, also referred to as polysilicon or poly, that has a resistive characteristic negatively correlated to temperature. The polysilicon resistor may be sized to meet certain frequency and power requirements. For one embodiment, the size of the polysilicon resistor may be chosen to limit the average VCC current consumed through its path to less than 250 nano-amps. For one embodiment, the overall current consumption of the RCO circuit is less than 1 micro-amp over temperature and process variations.

In designing the RCO circuit, factors such as the allowable droop on the nodes, the leakage current, and the amount of capacitance on the nodes have to be considered. Node capacitance may include gate capacitance, overlap capacitance, diffusion capacitance, diffusion capacitance from N type transistor devices, N type well parasitic capacitance, and PN devices. For example, if the allowable droop on a node is 200 milli-volts (mV), the leakage current is 400 nano-amps (nA), and the capacitance is 500 pico-Farads (pF), then the time between refreshes can be calculated as (500 pF·200 mV)/400 nA. We need to refresh every 250 micro seconds.

During the refresh cycle, more charge than the leakage current is supplied to the flash part. The supplied current is used to re-supply the leakage and supply the overhead due to the charge pumps turning on. In calculating the required current, a number of terms have to be summed. $I_{INPUT}$ is the current from VCC that is from the provided from the power supply.

$$I_{STANDBY}=I_{INPUT}=(I_{LEAKAGE}*T_P)/(\text{Pump Efficiency}*T_{ON})+(Q_{PMP\ POWER\ UP}/T_P)+(I_{REG}*T_{ON}/T_P)$$

where $$(Q_{PMP\ POWER\ UP}/T_P)=(I_{POWER\ UP}*T_{ON}/T_P)$$

and $$T_P=C_{NODE}*\text{allowed droop}/I_{LEAKAGE}$$

$T_{ON}$ is the 'on time' of the pumps or regulation circuits. The first term attributed to leakage current. The second term is attributed to overhead for bringing up the charge pump. Because the charge pumps have been idle, some power wastage occurs due to starting up the pumps. Every time the pumps are started up, a capacitance needs to be charged. The fixed amount of charging current needed is ($Q_{PUMP\ PWR\ UP}/T_P$). Furthermore, there is a fixed cost due to burning current while the pumps are on. The third term is overhead due to regulation. The second and third terms comprise the overhead of the refresh process. As the refresh frequency increases, then more power up and regulation current are involved.

$I_{LEAKAGE}$ is worse at hot temperatures. At room temperatures, $I_{LEAKAGE}$ decreases exponentially and the nodes do not have to be refreshed as often. $T_P$ has to be chosen such that the flash part will work with hot temperature leakage. Hence $T_P$ is designed based on hot temperature leakage so that the time between cycles shrink and refresh occurs more often. With the ring oscillators in the MFO, the circuit devices operate faster at room temperatures, causing the frequency to increase and correspondingly shortening the time between refresh cycles.

The current required for standby at room temperature is:

$$I_{STANDBY}=(I_{LEAKAGE}*T_P)/(\text{Pump Efficiency}*T_{ON})+(I_{PMP\ POWER\ UP}*T_{ON}/T_P)+(I_{REG}*T_{ON}/T_P)$$

$I_{LEAKAGE}$ is negligible at room temperature. However, the current due to the second and third terms go up because $T_P$ comes down. Hence the overhead is wasting current.

However, if $T_P$ is increased at low temperatures, then the refresh frequency is reduced at low temperatures and $I_{STANDBY}$ decreases. The method disclosed provides for increasing $T_P$ at lower temperatures and decreasing $T_{ON}$. This results in an overall reduction of $I_{STANDBY}$ at room temperature.

For one embodiment, a polysilicon resistor is used to control the capacitor charging rate. Other temperature dependent current controls or resistive elements may also be used. The polysilicon of one embodiment has a positive temperature coefficient wherein conductivity increases at higher temperature. Hence the polysilicon is more resistive at low temperatures and less current will conduct through it at room temperature. The RCO circuit frequency is inversely proportional to the RC time constant, so as the resistance increases at room temperature, the frequency decreases.

Similarly, the size of the capacitor may be chosen so that the RC time constant provides a basic oscillator frequency of 10 kilo-hertz. For one embodiment, the RCO circuit is designed to have a basic period of approximately 100 microseconds and to consume about 400 nano-amps when operating at two volts VCC and 100 degrees Celsius. Multiples of the basic period can be obtained by sending the RCO basic oscillator output to divide counters.

The N type field effect transistor device (N1) 530 has its source and drain terminals connected in series with the source and drain terminal of a P type field effect transistor device (P1) 525. Transistors N1 530 and P1 525 are configured together to form an inverter (I1) 535. The source terminal of N1 530 is connected to a ground potential. The source terminal of P1 525 is connected to VCC. The gate terminals of N1 530 and P1 525 are connected together to form the input of I1 535 at node 510 and in turn connected to the connection between R1 515 and C1 520. The drain terminal of N1 530 and the drain terminal of P1 525 are connected together and form the output terminal of I1 535. For one embodiment, transistors P1 525 and N1 530 are sized so that the trip point of inverter I1 535 is approximately $^{VCC}/_2$. The lengths of P1 525 and N1 530 may be sized such that minimal power is consumed from the VCC power source.

The inverter chain of one embodiment comprises of four inverters (I1 535, I2 540, I3 545, I4 550) connected in series. The output terminal of the first inverter (I1) 535 is connected to the input terminal of the second inverter (I2) 540. The output terminal of the I2 540 is connected to the input terminal of the third inverter (I3) 545. The output terminal of I3 545 is connected to the input terminal of the fourth inverter (I4) 550. The output 560 of I4 550 is also the output of the RCO circuit 500. The output 560 of the RCO circuit 500 is coupled to the 4-bit counter 420 of FIG. 4 for one embodiment.

The output 560 of I4 550 is fed back to another part of the RCO circuit 500. Output 560 is connected to the gate terminal of an N type field effect transistor device (G1) 505. The source terminal of G1 505 is connected to a ground potential and the drain terminal of G1 505 is connected to the input terminal of I1 535 at node 510. G1 505 functions as a reset device for the RCO circuit 500.

C1 520 is charged towards VCC through R1 515. The charging node 510 drives the input of I1 535 in the chain of inverters. The charging node 510 is discharged to a ground potential through grounding device (G1) 505, whose gate terminal is connected to output 560.

Figure 6A:
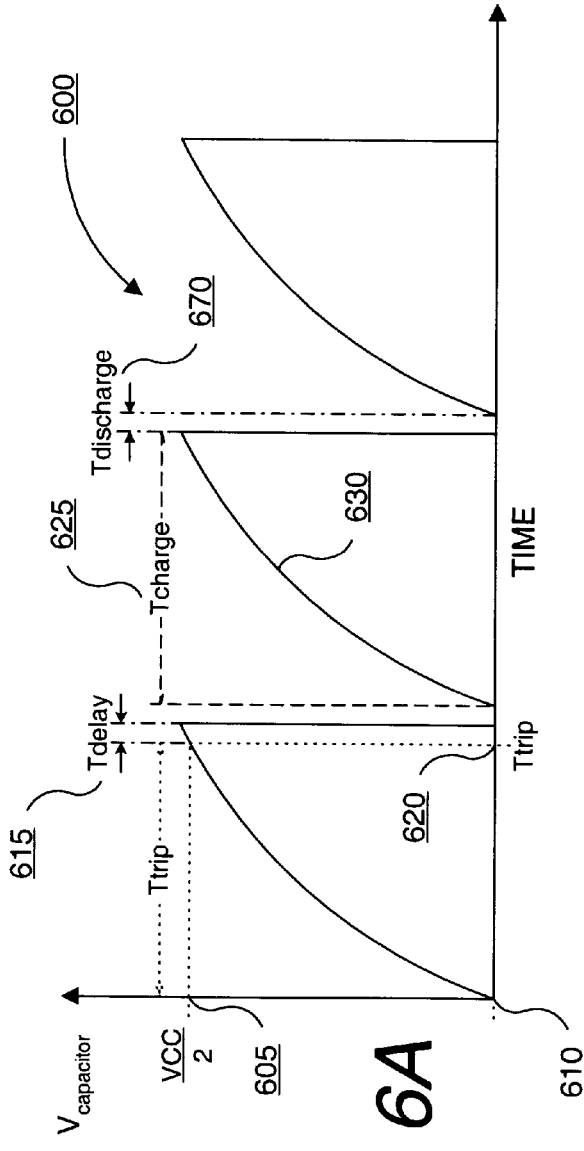
FIG. 6a is a graph of the voltage potential across the capacitor of one embodiment as the capacitor charges and discharges over time.
Figure 6B:
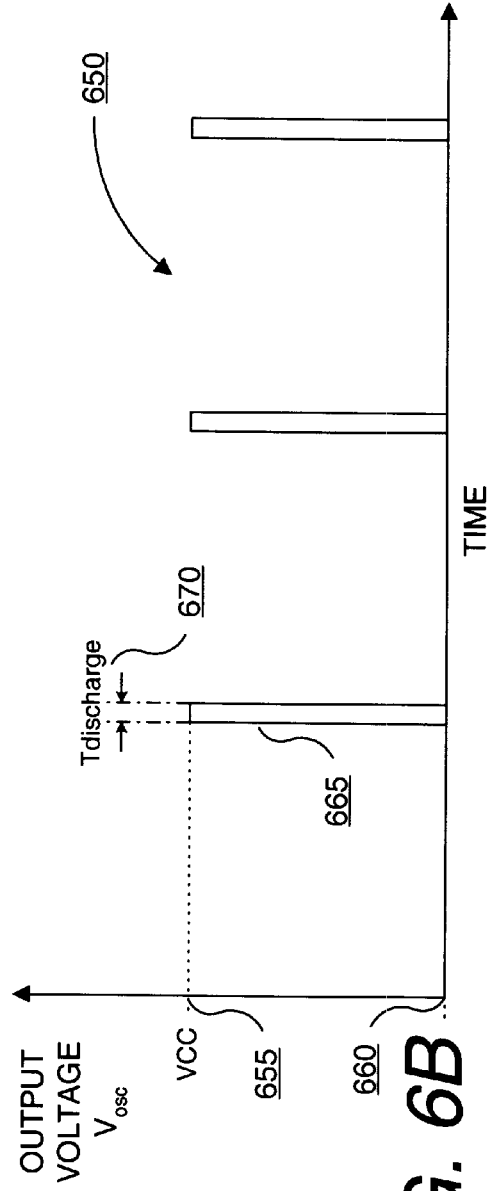
FIG. 6b is a graph of the output of a RCO circuit of one embodiment.

FIGS. 6a and 6b illustrate the potentials of certain nodes of a RCO circuit during the operation of one embodiment. FIG. 6a is a graph 600 of the voltage potential across the capacitor, $V_{capacitor}$, of one embodiment as the capacitor charges and discharges over time. FIG. 6b is a graph 650 of the output, $V_{osc}$, of a RCO circuit of one embodiment.

With reference to FIG. 5, the charging node 510 at the first terminal of C1 520 and input terminal of I1 535 starts out at approximately a ground potential, which results in I1 535 outputting a logical high value. The output of I1 535 results in a logical low value 660 at the output 560 of I4 550 at the end of the inverter chain. Thus the output 560 of the RCO circuit 500 is a logical low value 660. The G1 device 505 is currently off because the gate terminal, which is connected to the output 560, is at a logical low value 660.

As the RCO circuit 500 operates, C1 520 is charging towards VCC at node 510 through R1 515. The waveform 630 illustrates the potential across the capacitor, C1 520, during charging. Time $T_{trip}$ 620 of FIG. 6a is the time taken to reach the trip point of the first inverter, I1 535. The trip point potential ($V_{trip}$) of I1 535 of one embodiment is approximately $^{VCC}/_2$ 605. $T_{trip}$ of one embodiment is proportional to the RC time constant of R1 515 and C1 520.

When the charging node 510 approaches $^{VCC}/_2$ 605 at time $T_{trip}$ 620, the first inverter I1 535 is tripped and the output of I1 535 transitions from a high state 655 to a low state 660. The rest of the inverter chain is tripped in turn. A low state 660 at the output of I1 535 causes I4 550 to transition from a low state 660 to a high state 655 at its output terminal 560. The transition at the output 560 of I4 550 due to I1 535 tripping is delayed by time $T_{delay}$ 615 after the potential across C1 520 reaches the inverter trip point 605. $T_{delay}$ 615 is the time delay for a signal to propagate through the inverter chain. Time $T_{charge}$ 625 of waveform 630 in FIG. 6a is the time period during which C1 520 is charging. RC charging time $T_{charge}=T_{trip}+T_{delay}$.

The waveform 665 of FIG. 6b illustrates the output 560 of the inverter chain, which is also the output of the RCO circuit 500. The pulses between a low state 660 and a high state 655 are basic oscillator pulses of one embodiment. The transition of I4 550 from a low state 660 to a high state 655 is illustrated by the rising edge of the output pulse 665. When the oscillator output 560 is at a low state 660, reset device G1 505 is off because the gate of G1 505 is also receiving a low potential. But when the oscillator output 560 pulses and transitions to a high state 655, the gate of G1 505 receives a high potential. Thus G1 505 turns on and current flows through the N type device.

As current flows from node 510 through G1 505, capacitor C1 520 is discharged towards a ground potential. When node 510 discharges below the trip point of inverter I1 535, then the output of I1 535 transitions from a low state 660 to a high state 655. The transition at the output of I1 535 propagates through the inverter chain, wherein the output 560 of I4 550 transitions to a low state 660. The transition of I4 550 from a high state 655 to a low state 660 is illustrated by the falling edge of the output pulse 665. The low state 660 at the output 560 causes reset device G1 505 to turn off and stop conducting current. Node 510 stops discharging and capacitor C1 520 charges up again through resistor R1 515. Thus the cycle is repeated. The periodic charging and discharging process generates a clock signal at the output of I4 550, the end of the inverter chain.

RC discharge time $T_{discharge}$ 670 is the time period during which G1 505 is on and C1 520 is discharged. $T_{discharge}$ 670 is fairly short and approximately the propagation delay $T_{delay}$ 615 through the inverter chain. The basic RCO frequency is: $f=1/(T_{charge}+T_{discharge})$. Because $T_{discharge}=T_{delay}$ and $T_{charge}=T_{trip}+T_{delay}$, by substituting these terms into the frequency equation, RCO frequency $(f)=1/(T_{trip}+2*T_{delay})$. For one embodiment, $T_{delay}$ is approximately 2 microseconds and $T_{charge}$ is approximately 100 microseconds. If $T_{trip}>>T_{delay}$, then $T_{trip}$ is the dominant term. Because $T_{trip}$ is proportional to the RC time constant, f 1/RC. Hence, the RCO period is $T_{RCO}$ directly proportional to the RC time constant. In other words, the RCO period is a direct function of the resistance and the capacitance.

The capacitance of one embodiment is implemented using an Oxide-Nitride-Oxide (ONO) capacitor, which is fairly constant across temperatures. But because the resistance has a negative correlation with temperature, the resistance, and hence the oscillator period, vary inversely with the temperature. The resistance of one embodiment is implemented with a polysilicon resistor having the characteristic of resistivity correlating negatively with temperature changes.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method for achieving low standby power using a positive temperature correlated clock frequency comprising:
   conducting current through a resistance, said resistance fabricated of a material having a conductivity characteristic positively correlated with temperature, said material further without a conductivity characteristic negatively correlated with temperature, said material causing said current to increase with temperature;

charging a capacitor coupled to said resistance with said current;

triggering a transition in an output signal of an inverter chain when said capacitor is charged to a trip point of a first inverter located an input end of said inverter chain; and discharging said capacitor through a grounding device when said output signal activates said grounding device.

2. The method of claim 1 wherein said inverter chain comprises of an even number of inverters.

3. The method of claim 1 wherein said grounding device is a pass device comprising an input terminal, an output terminal, and a control terminal, said pass device coupled to a positively charged end of said capacitor at said input terminal, and passing charge based on a voltage potential of a control signal which is coupled to said control terminal of said pass device.

4. The method of claim 1 wherein said grounding device is an N type transistor.

5. The method of claim 1 wherein said output signal enables voltage regulation circuitry.

6. The method of claim 1 wherein said output signal enables a charge pump.

7. A method of generating a pulse comprising:

conducting current through a resistance, said resistance fabricated of material having a conductivity characteristic positively correlated with temperature and said material further without having a conductivity characteristic negatively correlated with temperature, said material to cause said current to increase with temperature;

charging a capacitor coupled to said resistance with said current;

triggering a transition in an output signal of an inverter chain when said capacitor is charged to a trip point of a first inverter located an input end of said inverter chain; and discharging said capacitor through a grounding device when said output signal activates said grounding device.

8. The method of claim 7 wherein said inverter chain comprises of an even number of inverters.

9. The method of claim 7 wherein said grounding device is a pass device comprising an input terminal, an output terminal, and a control terminal, said pass device coupled to a positively charged end of said capacitor at said input terminal, and passing charge based on a voltage potential of a control signal which is coupled to said control terminal of said pass device.

10. The method of claim 7 wherein said grounding device is an N type transistor.

11. The method of claim 7 wherein said output signal enables voltage regulation circuitry.

12. The method of claim 7 wherein said output signal enables a charge pump.

13. An apparatus for generating a positive temperature correlated clock frequency comprising:

a resistance, said resistance having conductivity positively correlated to temperature to cause a current to vary with temperature, wherein said current conducts through said resistance at a first rate at a first temperature and at a rate less than said first rate at temperatures lower than said first temperature;

a capacitor coupled to said resistance, wherein said capacitor charges up from said current;

an inverter chain having its input end coupled to a charging node, wherein said charging node is where said resistor and said capacitor are connected together, said inverter chain configured to transition an output signal at its output end based on amount of charge on said capacitor; and a reset device coupled to said charging node, said reset device having a control terminal coupled to said output signal of said inverter chain, and said reset device discharging said capacitor to a ground potential when said reset device is activated.

14. The apparatus of claim 13 wherein said inverter chain is triggered when said capacitor has charged to a trip point potential of a first inverter at said input end of said inverter chain.

15. The apparatus of claim 13 wherein said inverter chain comprises of an even number of inverters.

16. The apparatus of claim 13 wherein said reset device is a pass device comprising an input terminal, an output terminal, and a control terminal, said pass device coupled to said charging node at said input terminal, and passing charge based on a voltage potential of a control signal which is coupled to said control terminal of said pass device.

17. The apparatus of claim 13 wherein said reset device is an N type transistor.

18. The apparatus of claim 13 wherein said output signal enables voltage regulation circuitry.

19. The apparatus of claim 13 wherein said output signal enables a charge pump.

20. A resistor and capacitor based oscillator comprising:

a resistor, said resistor having conductivity positively correlated to temperature to cause a current to vary with temperature, wherein said current conducts through said resistor at a first rate at a first temperature and at a rate less than said first rate at temperatures lower than said first temperature;

a capacitor coupled to said resistor, wherein said capacitor charges up from said current;

an inverter chain having its input end coupled to a charging node, wherein said charging node is where said resistor and said capacitor are connected together, said inverter chain configured to transition an output signal at its output end based on amount of charge on said capacitor; and a reset device coupled to said charging node, said reset device discharging said capacitor to a ground potential when said reset device is activated.

21. The oscillator of claim 20 wherein said inverter chain is activated when said capacitor has charged to a trip point potential of a first inverter at said input end of said inverter chain.

22. The oscillator of claim 20 wherein said inverter chain comprises of an even number of inverters.

23. The oscillator of claim 20 wherein a control terminal of said reset device is coupled to said output signal of said inverter chain.

24. The oscillator of claim 20 wherein said reset device is a pass device comprising an input terminal, an output terminal, and a control terminal, said pass device coupled to said charging node at said input terminal, and passing charge based on a voltage potential of a control signal which is coupled to said control terminal of said pass device.

25. The oscillator of claim 24 wherein said control signal is said output signal.

26. The oscillator of claim 20 wherein said reset device is an N type transistor.

27. The oscillator of claim 20 wherein said output signal enables voltage regulation circuitry.

28. The oscillator of claim 20 wherein said output signal enables a charge pump.

29. A circuit comprising:
   means for generating a trigger signal, conductivity of said signal generating means having a positive correlation to temperature and without a negative correlation to temperature;
   means for generating an output pulse coupled to said signal generating means, wherein said trigger signal causes said means for creating an output pulse to activate; and
   means for resetting said circuit coupled to said signal generating means.

30. The circuit of claim 29 wherein said means for generating a trigger signal comprises:
   a resistance, said resistance having conductivity positively correlated to temperature to cause a current to vary with temperature, wherein said current conducts through said resistor at a first rate at a first temperature and at a rate at less than said first rate at temperatures lower than said first temperature; and
   a capacitor coupled to said resistance, wherein said capacitor charges up from said current.

31. The circuit of claim 30 wherein said means for generating an output pulse is activated when said capacitor has charged to a trip point potential of said generating pulse generating means.

32. The circuit of claim 29 wherein said means for generating an output pulse comprises an inverter chain.

33. The circuit of claim 29 wherein said means for generating an output pulse comprises a ring oscillator.

34. The circuit of claim 32 wherein said inverter chain comprises of an even number of inverters.

35. The circuit of claim 29 wherein said means for resetting comprises of a pass device comprising an input terminal, an output terminal, and a control terminal, said pass device coupled to said signal generating means at said input terminal, and passing charge based on a voltage potential of a control signal which is coupled to said control terminal of said pass device.

36. The circuit of claim 35 wherein said control signal is said output pulse.

37. The circuit of claim 29 wherein said means for resetting comprises of an N type transistor.

38. The circuit of claim 29 wherein said output pulse enables voltage regulation circuitry.

39. The circuit of claim 29 wherein said output pulse enables a charge pump.

* * * * *

UNITED STATES PATENT AND TRADEMARK OFFICE
CERTIFICATE OF CORRECTION

PATENT NO. : 6,163,225
DATED : December 19, 2000
INVENTOR(S) : Sundaram et al.

It is certified that error appears in the above-identified patent and that said Letters Patent is hereby corrected as shown below:

Column 10,
Line 39, delete "f 1/RC,", insert -- $f \propto 1/RC$ --.

Signed and Sealed this

Fourth Day of June, 2002

Attest:

JAMES E. ROGAN
Attesting Officer     Director of the United States Patent and Trademark Office